US012690460B2

(12) United States Patent
Entringer et al.

(10) Patent No.: US 12,690,460 B2
(45) Date of Patent: Jul. 21, 2026

(54) SEMICONDUCTOR WAFER

(71) Applicant: EM Microelectronic—Marin SA, Marin (CH)

(72) Inventors: Christophe Entringer, Corcelles-près-Concise (CH); Yves Dupraz, Valeyres sous Montagny (CH); Pierre Muller, Marin-Epagnier (CH); Zeng Wang, Bienne (CH); Alexis Durand, Cudrefin (CH); Arthur Hugh MacDougall, Cornaux (CH)

(73) Assignee: EM Microelectronic-Marin SA, Marin (CH)

( * ) Notice: Subject to any disclaimer, the term of this patent is extended or adjusted under 35 U.S.C. 154(b) by 403 days.

(21) Appl. No.: 18/463,771

(22) Filed: Sep. 8, 2023

(65) Prior Publication Data

US 2024/0088066 A1 Mar. 14, 2024

(30) Foreign Application Priority Data

Sep. 9, 2022 (EP) .................................... 22194854

(51) Int. Cl.
| | |
|---|---|
| *H10W 42/00* | (2026.01) |
| *H10P 54/00* | (2026.01) |
| *H10W 74/10* | (2026.01) |
| *H10W 72/20* | (2026.01) |

(52) U.S. Cl.
CPC ............. *H10W 42/00* (2026.01); *H10P 54/00* (2026.01); *H10W 74/147* (2026.01); *H10W 72/252* (2026.01)

(58) Field of Classification Search
CPC ... H01L 23/585; H01L 21/78; H01L 23/3192; H01L 24/13; H01L 2224/13144; H01L 2224/13147; H01L 2224/13155; H01L 23/564
See application file for complete search history.

(56) References Cited

U.S. PATENT DOCUMENTS

| | | | |
|---|---|---|---|
| 2014/0167226 A1* | 6/2014 | Miccoli ................. | H10W 46/00 257/620 |
| 2018/0096952 A1* | 4/2018 | Miccoli ................. | H01L 23/562 |
| 2021/0193524 A1 | 6/2021 | Kamphuis et al. | |

FOREIGN PATENT DOCUMENTS

WO 2018/063642 A2 4/2018

OTHER PUBLICATIONS

European Search Report for 22 19 4854, dated Feb. 15, 2023.

* cited by examiner

*Primary Examiner* — Fernando L Toledo
*Assistant Examiner* — Shawn Shaw Muslim
(74) *Attorney, Agent, or Firm* — Sughrue Mion, PLLC

(57) ABSTRACT

A semiconductor wafer (1a, 1b) including a plurality of chips (2) and a separation zone (3) spacing the semiconductor chips (2) from each other in this wafer (1a, 1b), such a separation zone (3) extending from a front face (4a) to an opposite backside face (4b) of this wafer (1a, 1b), this separation zone (3) includes a scribe line (6) configured to be diced using plasma etching and an inlet area (13) of this scribe line (6), the inlet (13) being delimited by free ends of plasma etch-resistant material layers (9) extending each from a peripheral wall (20) of a functional part (18) of a chip (2) into the scribe line (6) by overlapping a top of a seal ring (7) of this chip (2).

19 Claims, 5 Drawing Sheets

Fig. 2

SEMICONDUCTOR WAFER

CROSS REFERENCE TO RELATED APPLICATIONS

This application claims priority to European Patent Application No. 22194854.0 filed Sep. 9, 2022, the entire contents of which are incorporated herein by reference.

FIELD OF THE INVENTION

The present invention relates to a semiconductor wafer comprising a plurality of chips and a particular separation zone spacing the chips from each other in this wafer, the said zone providing a mechanism for separating the chips from the wafer.

BACKGROUND OF THE INVENTION

In the prior art, it is well-none that modern integrated circuits are mainly manufactured on semiconductor wafers. Each of these semiconductor wafers typically includes tens, hundreds, or even thousands of dies (also known as semiconductor chips before being extracted from the wafer) comprising identical circuits built in this wafer. These dies are separated from each other by a separation zone comprising a scribe line which is used to separate based on a dicing process, the individual dies from the wafer once the semiconductor chips have been fabricated. In this context, dicing refers to a process of separating a wafer into individual semiconductor chips so that the individual semiconductor chips can be mounted on a basic frame and encapsulated into a lead frame or a printed circuit package.

Nowadays, integrated circuit (IC) manufacturers are employing increasingly smaller dimensions and corresponding technologies to make smaller, high-speed semiconductor devices. Along with these advancements, the challenges of maintaining yield and throughput have also increased. Indeed, there is a demand for high volume of chips production especially for these chips with small dimensions. Such a demand mainly leads to increase the number of chips per wafer. That situation has the effect of increasing the dicing time per wafer and of making the dicing operations more complex to separate the wafer into a plurality of semiconductor chips.

In light of this, there is a need to develop a solution which makes it possible to overcome the drawbacks of the state of the art.

SUMMARY OF THE INVENTION

In this context, embodiments of the present disclosure provide a semiconductor wafer comprising a plurality of chips and a separation zone spacing the semiconductor chips from each other in this wafer, such a separation zone extending from a front face to an opposite backside face of this wafer, this separation zone includes a scribe line configured to be diced using plasma etching and an inlet area of this scribe line, the inlet being delimited by free ends of plasma etch-resistant material layers extending each from a peripheral wall of a functional part of the corresponding chip into the scribe line by overlapping a top of a seal ring of this chip.

In other embodiments:

that the separation zone comprises a passivation layer hermetically sealing the inlet area of the scribe line;

the separation zone comprises a passivation layer having a width which is less than a width separating the seal rings included in the scribe line;

the separation zone comprises a passivation layer hermetically linking together the free ends of plasma etch-resistant material layers of the chips;

each plasma etch-resistant material layer is formed by two parts, a first part comprising the free end protruding from the peripheral wall of the functional part of each chip and a second part comprised in this functional part;

the first part protrudes from the peripheral wall into the scribe line by overlapping a top of the seal ring of this chip;

the first part protrudes from the peripheral wall into the scribe line by having a lower face arranged above a top layer of the seal ring of this chip;

the first part protrudes from the peripheral wall into the scribe line by having a lower face connected to an interconnected metal components of a seal ring of this chip;

the second part of the plasma etch-resistant material layer is comprised in an upper part of the peripheral wall of the functional part of each chip;

the first part of the plasma etch-resistant material layer is comprised to an upper part of a lateral zone of the scribe line, the upper part being joined to the upper part of the peripheral wall of a functional part of each chip;

the plasma etch-resistant material layer of each chip is set up to cooperate with plasma etch-resistant material layers of its neighboring chips to define the inlet area of the scribe line;

the separation zone comprises a passivation layer covering the inlet area;

the scribe line contains a material stack configured to be diced using plasma etching;

the wafer comprises a passivation layer covering a part of an upper surface of each chip exposed to the environment;

the wafer comprises a layer of material partially resistant to plasma etching covering a passivation layer arranged over a part of an upper surface of each chip exposed to the environment;

the semiconductor chip is a RFID chip, a NFC chip and/or a Bluetooth chip;

the passivation layer, the plasma etch-resistant material layer and the layer of material partially resistant are made from different materials.

BRIEF DESCRIPTION OF THE DRAWINGS

The present invention will be described subsequently in more detail with reference to the attached drawing, given by way of examples, but in no way limited thereto, in which:

FIG. 2 is a cross-sectional view of a portion of this semiconductor wafer shown in FIG. 1 before dicing the wafer using plasma etching technology, in a first embodiment of the invention;

DETAILED DESCRIPTION OF THE INVENTION

Throughout the specification and claims, the following terms take the meanings explicitly associated herein, unless the context clearly dictates otherwise. The meaning of "a," "an," and "the" includes plural reference, the meaning of "in" includes "in" and "on." The term "circuit" means either a single component or a multiplicity of components, either active or passive, that are connected together to provide a desired function.

Additionally, directional terms such as "on", "over", "top", "bottom", "left", "right" are used with reference to the orientation of the Figure(s) being described. Because components of embodiments of the present invention can be positioned in a number of different orientations, the directional terminology is used for purposes of illustration only and is in no way limiting. When used in conjunction with layers of a semiconductor wafer or corresponding circuit or device in the semiconductor wafer, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

Figure 1:
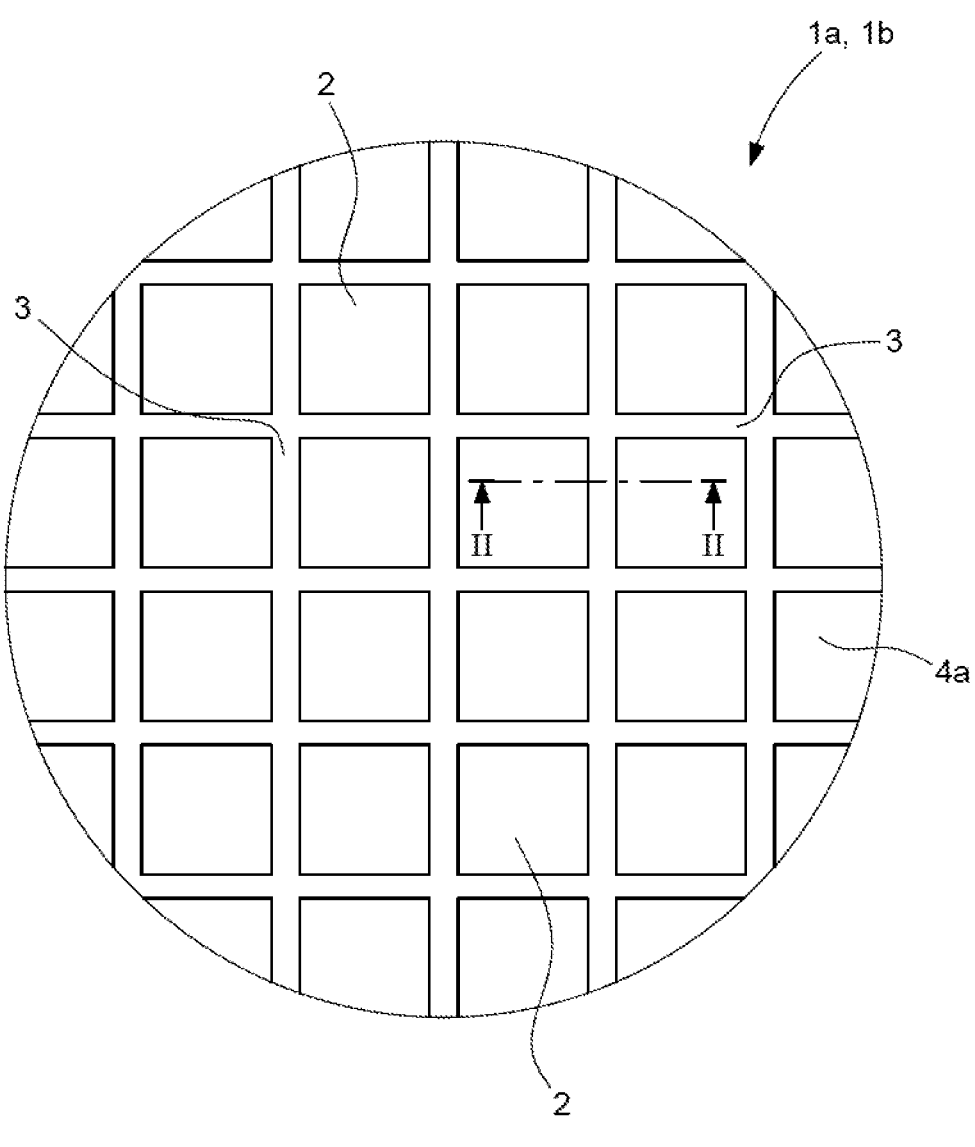
FIG. 1 is a schematic illustration of a top view of a semiconductor wafer comprising a plurality of chips in accordance with some exemplary embodiments of the invention.

With reference to FIG. 1, a top view of a semiconductor wafer 1a, 1b is illustrated. This wafer 1a, 1b comprises a plurality of semiconductor chips 2, which can be in some embodiments, RFID chips, NFC chips or Bluetooth chips. In this wafer 1a, 1b, this plurality of chips 2 is spaced from each other by a separation zone 3.

Furthermore, the wafer 1a, 1b also comprises a chip carrier substrate 5 providing mechanical support, so that the wafer 1a, 1b does not break in the formation of structures constituting notably the plurality of chips 2. This carrier substrate 5 may be a blank silicon wafer 1a, 1b including no circuits formed therein in accordance with some exemplary embodiments. This carrier substrate 5 includes a backside face 4b of this wafer 1a, 1b and extending horizontally in the wafer 1a, 1b and more specifically into the plurality of chips 2 and the separation zone 3. As we will see later, this carrier substrate 5 is configured in particular to be diced by plasma etching.

In this configuration, the wafer 1a, 1b includes a front face 4a formed by the top of this wafer 1a, 1b, and also the backside face 4b formed by the base of the carrier substrate 5 as mentioned earlier.

The FIGS. 2 to 7 show a cross-sectional view of a portion of the wafer 1a, 1b, wherein the cross-sectional view is obtained from the plane crossing line II-II in FIG. 1. In this Figures, each chip 2 of the wafer 1a, 1b includes a functional part 18 also called "active part". This functional part 18 including integrated circuits, is built on a part of the carrier substrate 5. Due to this, the chip 2 is essentially formed by this functional part 18 and the part of the substrate 5 on which it is built.

In this setup, each chip 2 comprises an upper surface 12a formed by the top of the functional part 18, and also a lower surface 12b formed by the base of the corresponding part of the carrier substrate 5. It can be noted that these upper and lower surfaces 12a, 12b are contained respectively in the front and backside faces 4a, 4b of the wafer 1a, 1b.

Furthermore, each chip 2 includes a seal ring 7 forming a solid metal ring adjacent to a peripheral wall of the functional part 18, so that moisture and detrimental chemicals may not penetrate into this chip 2 and reach an interconnected metal components 15 within this seal ring 7. The interconnected metal components 15 made of metal lines and conductive vias, both formed in dielectric layers. The metal lines and vias are physically connected. This seal ring 7 extends vertically in the chip 2 perpendicular or significantly perpendicular to the carrier substrate 5. In the wafer 1a, 1b, the seal ring 7s are disposed along the separation zone 3.

In addition, each chip 2 also comprises at least one bump 14 protruding from its upper surface 12a formed by the top of its functional part 18. This bump 14 is made up of a stack of several layers of different materials such as layers of gold, copper and nickel. The bump 14 is preferably resistant to plasma etching. As we will see later, such bump 14 contributes to block the plasma etching in the wafer 1a, 1b.

As we discussed before, the wafer 1a, 1b includes the separation zone 3 spacing the chips 2 from each other. The separation zone 3 extends from the front face 4a to the backside face 4b of this wafer 1a, 1b. This separation zone 3 formed between the chips 2, may provide a mechanism for separating/extracting the chips 2 from the wafer 1a, 1b.

More particularly, this separation zone 3 includes a scribe line 6 located between the seal rings 7 of neighboring chips 2. With this setup, both side walls of this scribe line 6 are in contact with these seal rings 7. Moreover in the embodiment of the invention illustrated on FIGS. 2 to 4, both side walls are in contact or comprise parts of peripheral walls 20 of the chips located over the tops of the seal rings 7. In other words, these parts of the peripheral walls 20 are located between the tops of the seal rings 7 and the front face 4a of the wafer 1a, 1b. Such a scribe line 6 (also known as kerf or frame) is an area in the wafer 1a, 1b, which is configured to separate individual chip 2 at the end of wafer 1a, 1b processing. More specifically, the scribe line 6 contains a material stack configured to be diced using plasma etching, this material stack being built on a corresponding part of the carrier substrate 5 of the wafer 1a, 1b. This material stack which is preferably an oxide stack, extends from the part of the carrier substrate 5 to the front face 4a of the wafer 1a, 1b. It can be noted that the top of this material stack forms an upper surface of the scribe line 6.

Moreover, the separation zone 3 comprises:

an inlet area/region/zone 13 also named "plasma etching area/region/zone" defined in the front face 4a of the wafer 1a, 1b, layers of material resistant 9 to plasma etching such as layers of aluminium.

Such plasma etch-resistant material layers 9 contribute to block the plasma etching in the wafer 1a, 1b. In addition, these layers are arranged in the wafer 1a, 1b for delimiting the inlet area 13 which gives access to the oxide stack contained in the scribe line 6. Each plasma etch-resistant material layer 9 extends from a peripheral wall of a functional part 18 of a chip 2 into the scribe line 6. In this context, this plasma etch-resistant material layer 9 is a part of this functional part 18. In other words, each chip 2 includes this layer 9, which helps to form the inlet area 13 in the wafer.

This plasma etch-resistant material layer 9 is formed by two parts. A first part comprising a free end of this layer 9 and which is localised in the scribe line 6 of the separation zone 3 and a second part which is completely included in this functional part 18. In this configuration, the first part protrudes from the peripheral wall of the functional part 18 of each chip 2 into the scribe line 6:

by overlapping a top of the seal ring 7 of this chip 2, and/or by having a lower face arranged above a top layer of the seal ring 7 of this chip 2, and/or by having a lower face linked or connected to an interconnected metal components 15 of a seal ring 7 of this chip 2.

In reference to the FIGS. 2 to 7, each plasma etch-resistant material layer 9 is included both in the functional part 18 of the chip 2 and in the material stack of the scribe line 6 located in the immediate vicinity of this chip 2. This layer 9 extends from an upper part 16 of the peripheral wall of the functional part 18 of the chip 2 to an adjoining upper part 17 of a lateral zone of the scribe line 6 by being arranged above the top of the seal ring 7 that is to say a top layer of this seal ring 7. In this configuration, the second part of the plasma etch-resistant material layer 9 is comprised in this upper part 16 of the peripheral wall of the functional part 18 of each chip 2. Regarding the first part of the plasma etch-resistant material layer 9, it is comprised in the upper part 17. It can be noted that this upper part 16 of the peripheral wall of the functional part 18 of the chip 2 and the upper part 17 of the lateral zone of the scribe line 6 are joined together at the peripheral wall of the chip 2.

With this set up, the upper part 16 of the peripheral wall of the functional part 18 and the upper part of the lateral zone of the scribe line 6 form together a volume, which is occupied by this layer. It can be noted that this layer extends in this volume while being parallel or substantially parallel to the carrier substrate 5 and/or perpendicular or substantially perpendicular to the seal ring 7. In addition, this layer extends in this volume while being perpendicular or substantially perpendicular to the peripheral wall of the chip 2 to which it is attached.

In this configuration, such a plasma etch-resistant material layer 9 is positioned between the front face 4a of the wafer 1a, 1b and the top layer of the seal ring 7. In other word, this layer 9 is located under both the upper surfaces 12a of the functional part 18/chip 2 and the scribe line 6 formed by the upper surface 19 of the top of the material stack (e.g. the oxide stack), and the top layer of the seal ring 7. It can be understood that in this configuration this layer by extending from the functional part 18 of the chip 2 to the material stack comprised in the scribe line 6, overlaps the top layer of the seal ring 7 of this chip 2.

In the wafer 1a, 1b, the plasma etch-resistant material layer 9 of each chip 2 is set up to cooperate with the plasma etch-resistant material layers 9 of its neighboring chips 2 in order to define the inlet area 13 of the separation zone 3 more specifically the inlet area 13 of the scribe line 6. In this context, the plasma etch-resistant material layer 9 of each chip 2 comprises a free end which is able to cooperate with the free ends of the plasma etch-resistant material layers 9 of its neighboring chips 2 in order to delimitate this inlet area 13.

The plasma etch-resistant material layer 9 includes an upper face which is localised in the scribe line 6 under the front face 4a of the wafer 1a, 1b. In the embodiments of this wafer 1a, 1b illustrated in FIGS. 2 to 7, this upper face can comprise a part of this front face 4a of the wafer 1a, 1b such a part being located in the upper part 16 of the peripheral wall of the functional part 18 of the chip 2 and also in the said upper 17 part of the lateral zone of the scribe line 6. Put another way, the upper face of this layer 9 forms a part of the front face 4a of the wafer 1a, 1b located in the upper part 16 of the peripheral wall of the functional part 18 of the chip 2 and also in the said upper part 17 of the lateral zone of the scribe line 6.

Figure 2:
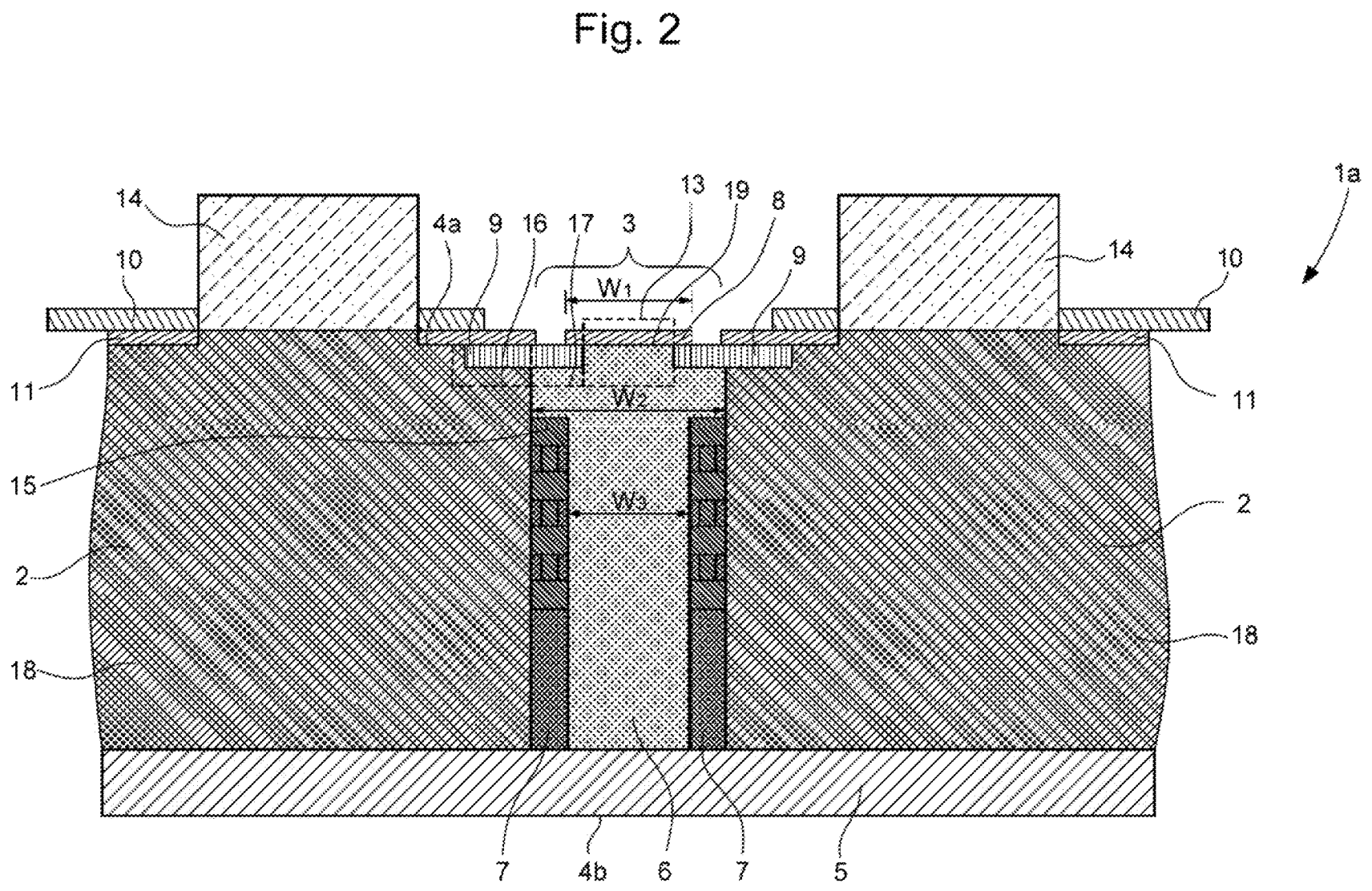
Figure 3:
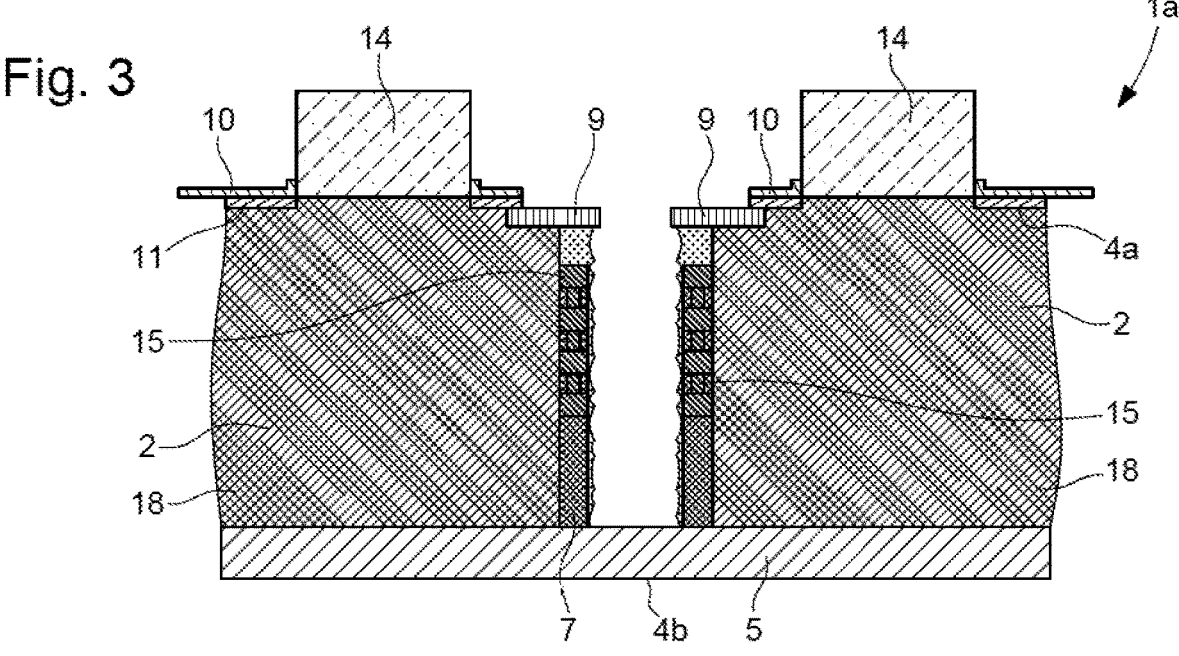
FIG. 3 is a cross-sectional view of this portion of this semiconductor wafer after a first etching process of this wafer has been performed using plasma etching technology, in the first embodiment of the invention.
Figure 4:
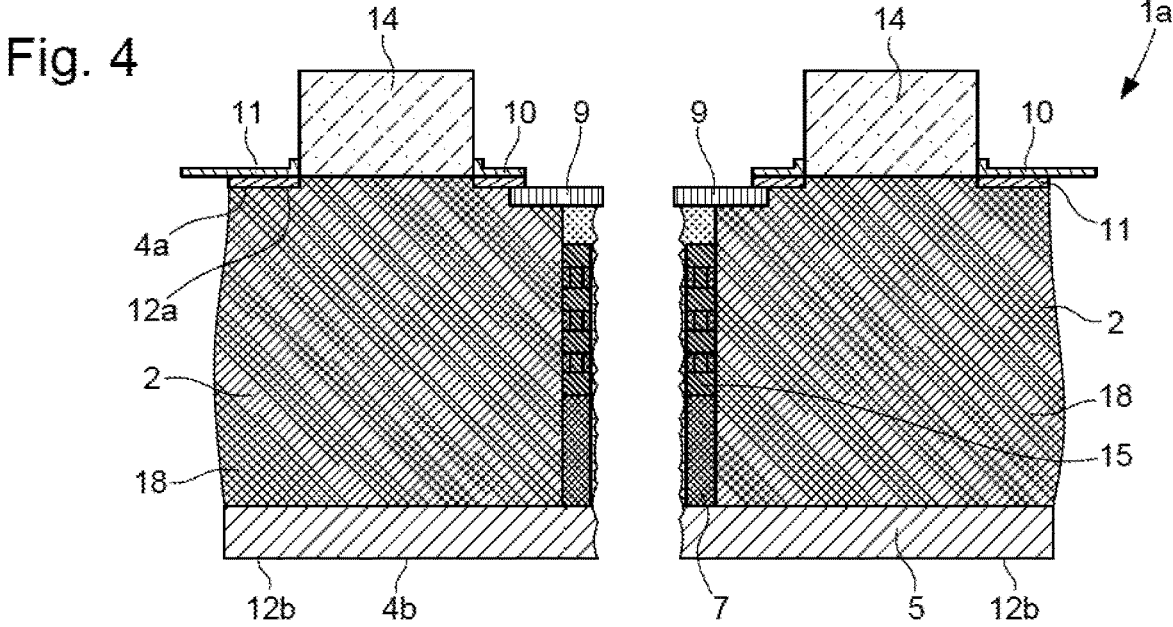
FIG. 4 is a cross-sectional view of this portion of this semiconductor wafer after a second etching process of this wafer has been performed using plasma etching technology, in the first embodiment of the invention.

In the embodiment of the wafer 1a illustrated in FIGS. 2 to 4, this layer of material resistant 9 comprises also a lower face opposite to the upper face. This lower face overlaps the top layer of the seal ring 7 of the chip 2 by being arranged facing this top layer more particularly by being located above this top layer. It can be noted that in this configuration, the layer of material resistant 9 is not connected to the interconnected metal components 15 arranged within seal ring 7. This positioning of that layer of material resistant 9 relatively to the top layer of the seal ring 7, allows to limit electrical perturbation from the environment/outside. Indeed, the seal ring 7 could be accessible from external electrostatic aggressions.

Figure 5:
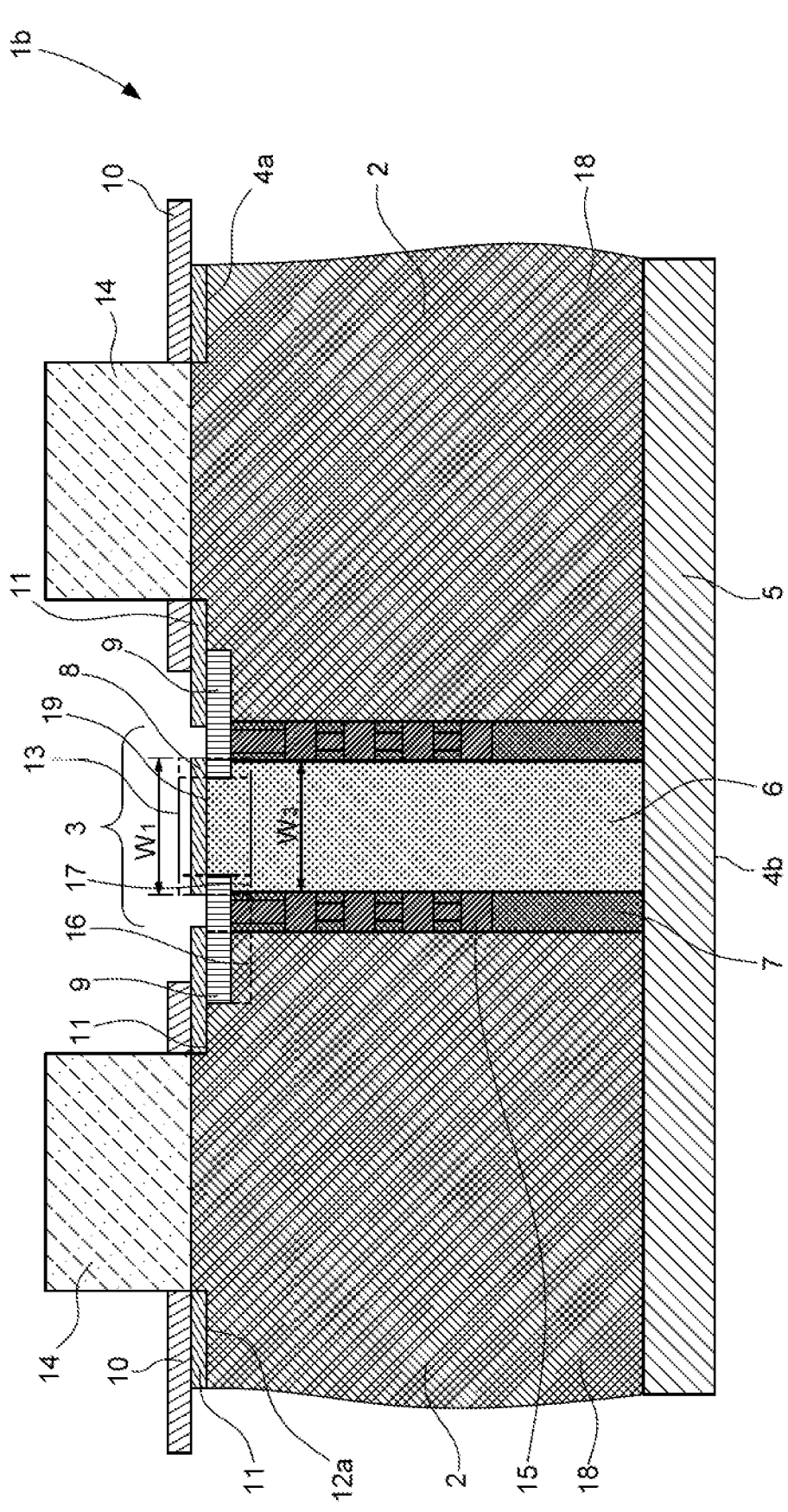
FIG. 5 is cross-sectional view of a portion of this semiconductor wafer shown in FIG. 1 before dicing the wafer using plasma etching technology, in a second embodiment of the invention.
Figure 6:
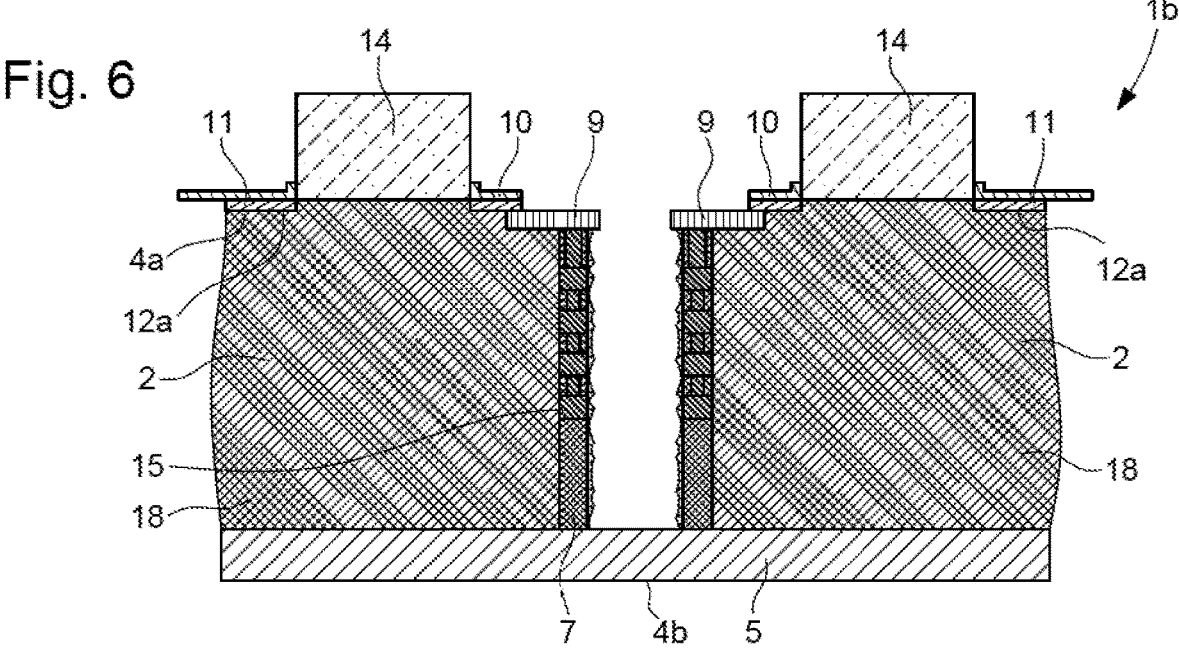
FIG. 6 is a cross-sectional view of this portion of this semiconductor wafer after the first etching process of this wafer has been performed using plasma etching technology, in the second embodiment of the invention.
Figure 7:
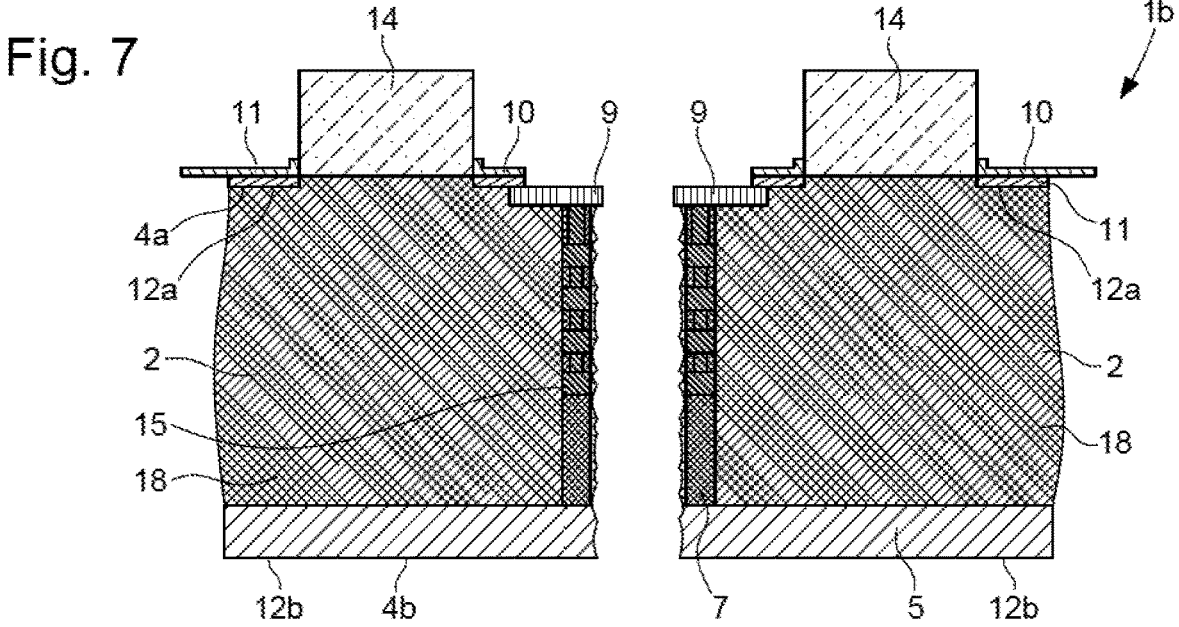
FIG. 7 is a cross-sectional view of this portion of this semiconductor wafer after the second etching of this wafer has been performed using plasma etching technology, in the second embodiment of the invention.

In the second embodiment of the wafer 1b illustrated in FIGS. 5 to 7, the lower face of this layer of material resistant 9 is connected to the interconnected metal components 15 of the seal ring 7. This second embodiment offers the advantage regarding the first embodiment that the seal ring 7 can include more metal lines.

Furthermore, the separation zone 3 also comprises a passivation layer 8 covering the inlet area 13 or sealing/closing the inlet area 13. More specifically, this passivation layer 8 covers a part of the upper faces of the plasma etch-resistant material layers 9 that delineated/defined that inlet area 13. That is, this passivation layer 8 covers a part of the upper faces of the plasma etch-resistant material layers 9 of the chips 2 that are close to each other. This part of this layer 9 which is covered by the passivation layer 8 being preferably includes in the said upper part 17 of lateral zone of the scribe line 6. Moreover, this passivation layer 8 also covers the material stack constituting the scribe line 6 more specifically the top of this material stack forming the upper surface 19 of the scribe line 6. In this configuration, the passivation layer 8 hermetically seals the inlet area 13 of the scribe line 6. In other words, this passivation layer 8 hermetically links together the free ends of plasma etch-resistant material layers 9 of the chips 2. It can be noted that the passivation layer 8 has a width W1 which is less than:

a width W2 separating in the scribe line 6, the parts of peripheral walls 20 of the chips located above the tops of the seal rings 7, for the embodiment illustrated on FIGS. 2 to 4, and/or a width W3 separating the seal rings 7 included in the scribe line 6 for the embodiments illustrated on FIGS. 2 to 4 and FIGS. 5 to 7

On the other hand, the wafer 1a, 1b also comprises a passivation layer 11 covering the part of the upper surface 12a of each chip 2 which is exposed to the environment.

It can be noted that, depending on the environment, these passivation layers 8, 11 need to have good adhesion, also during stressing, they are usually chemically inert, corrosion-resistant dielectrics (acting as diffusion barriers to water diffusion) and with wide bandgap (and thus high electrical breakdown strength). It is therefore in general Al2O3, SiO2, Si3N4, etc. . . . .

In addition, the wafer 1a, 1b includes a layer of material partially resistant 10 to plasma etching covering the passivation layer 11 arranged over the part of the upper surface 12a of each chip 2 exposed to the environment. This layer of material partially resistant 10 to plasma etching is preferably a layer of polyimide. It can be noted that the passivation layer 11 and this layer of material partially resistant 10 to plasma etching encircle the base of each bump 14 of the chip 2. Such layer of material partially resistant contributes to block the plasma etching in the wafer 1a, 1b.

In these embodiments, the plasma etch-resistant material layers 9, the layers of passivation 8, 11, the layers of material partially resistant 10 to plasma etching are formed during wafer 1a, 1b fabrication. Furthermore, the passivation layer 8, the plasma etch-resistant material layer 9 and the layer of material partially resistant 10 are preferably made from different materials.

Furthermore, in reference to FIGS. 3 to 7, an operation for separating the wafer 1a, 1b into a plurality of semiconductor chips 2, is illustrated. This operation implements notably two etching processes performed on the wafer 1a, 1b.

More specifically, in the FIG. 3 or 6, a first etching process has been performed on the wafer 1a, 1b in order to etch the material stack and the passivation layer 8 which covered it. This material stack and the passivation layer 8 contained in the separation zone 3, are configured to be diced using plasma etching. This first etching process comprises the implementation of a plasma oxide etching when that material stack is an oxide stack. It may be noted that during this plasma oxide etching, the wafer 1a, 1b—more particularly the plurality of chips 2—is protected against the plasma oxide attacks by the at least one bump 14, the layers of material partially resistant 10 to plasma etching here the layers of polyimide and the plasma etch-resistant material layers 9 here the layers of aluminium. It can be observed that the passivation layer 8 covering the inlet area 13 which is not protected by the layer of polyimide, is fully etched until the plasma reaches the layers of aluminium. Moreover, once this passivation layer 8 has been etched, the plasma enters into the scribe line 6 through the inlet area 13 and etches the oxide stack contained in this scribe line 6 until the carrier substrate 5. In this set up, the etching speed is similar for the layer of polyimide and the oxide stack in the scribe line 6 because the layer of polyimide has been chosen to be thicker than the oxide stack.

After the implementation of the first etching process, the layer of aluminium is partially exposed to the environment and more particularly to the ambient air. The metal lines of the interconnected metal components 15 within seal ring 7 of each chip 2 are covered by the remaining oxide comprised in the lateral zones of the scribe line 6. Indeed all the external part of the seal ring 7 already covered by the oxide stack comprised in the scribe line 6, is covered by this remaining oxide. This remaining oxide results from the arrangement of the plasma etch-resistant material layer 9 relative to the top layer of the seal ring 7. Indeed, for each chip 2, the plasma etch-resistant material layer 9 is overlapping this top layer of the seal ring 7. In other word, the overlapping of this top layer by plasma etch-resistant material layer 9 is configured to maintain the metal lines covered by the remaining oxide. Consequently, the metal lines are protected against external moisture.

Furthermore, it should be noted that the remaining layers of polyimide are thinner than before the starting of the first etching process. In addition, the parts of the layer of passivation arranged over the part of the front face 4a of each chip 2 that the layer of polyimide did not cover, have been etched.

Then in the FIG. 4 or 7, a second etching process following the first one is performed on the wafer 1a, 1b to etch the carrier substrate 5 which is configured to be diced using plasma etching. To do this, this second etching process sets out the implementation of a plasma silicon etching when the layer of material constituting this substrate 5 is a layer of silicon.

Furthermore, it can be noted that each plasma etch-resistant material layer 9 stays attached to the chip 2 after the operation for separating the wafer 1a, 1b into a plurality of semiconductor chips 2. Under these circumstances, this layer can be considered as forming part of this chip 2.

Finally, we will note that, such wafer 1a, 1b contributes to optimize the number of chips 2 per wafer 1a, 1b and hence the product cost by reducing the width of the separation zone 3 and more specifically of the inlet area 13 of the scribe line 6. For example, this width of the inlet area 13 is comprised between 3 and 10 μm, and preferably 5 μm.

Moreover, such a wafer 1a, 1b contributes to improve the execution of the operation for separating the wafer 1a, 1b into a plurality of semiconductor chips 2 compared to wafers in the prior art, and that especially when semiconductor chips 2 have small or even tiny dimensions.

While the present invention has been particularly shown and described with reference to exemplary embodiments thereof, it will be understood by one of ordinary skill in the art that various changes in form and details may be made therein without departing from the spirit and scope of the present invention as defined by the following claims.

The invention claimed is:

1. A semiconductor wafer (1a, 1b) comprising a plurality of chips (2) and a separation zone (3) spacing the semiconductor chips (2) from each other in this wafer (1a, 1b), such a separation zone (3) extending, along a first direction, from a front face (4a) to an opposite backside face (4b) of this wafer (1a, 1b), this separation zone (3) includes a scribe line (6) configured to be diced using plasma etching and an inlet area (13) of this scribe line (6), the inlet (13) being delimitated by free ends of plasma etch-resistant material layers (9) extending each from a peripheral wall of a functional part (18) of a chip (2) into the scribe line (6) by overlapping a top of a seal ring (7) of this chip (2), and wherein, along the first direction, at least part of each of the plurality of chips (2) is extended further from the backside face (4b) than is any portion of the plasma etch-resistant material layers (9) that is, of the plasma etch-resistant material layers (9), furthest from the backside face (4b).

2. The wafer (1a, 1b) according to claim 1, wherein the separation zone (3) comprises a passivation layer (8) hermetically sealing the inlet area (13) of the scribe line (6).

3. The wafer (1a, 1b) according to claim 1, wherein the separation zone (3) comprises a passivation layer (8) having a first width (W1) which is less than a second width (W3) separating the seal rings (7) included in the scribe line (6).

4. The wafer (1a, 1b) according to claim 1, wherein the separation zone (3) comprises a passivation layer (8) hermetically linking together the free ends of plasma etch-resistant material layers (9) of the chips (2).

5. The wafer (1a, 1b) according to claim 1, wherein each plasma etch-resistant material layer (9) is formed by two parts, a first part comprising the free end protruding from the peripheral wall of the functional part (18) of each chip (2) and a second part completely included in this functional part (18).

6. The wafer (1a, 1b) according to claim 1, wherein each plasma etch-resistant material layer (9) is formed by two parts, a first part comprising the free end protruding from the peripheral wall of the functional part (18) of each chip (2) and a second part completely included in this functional part (18), the first part being protrude from the peripheral wall into the scribe line (6) by overlapping a top of the seal ring (7) of this chip (2).

7. The wafer (1a, 1b) according to claim 1, wherein a first part of the plasma etch-resistant material layer (9) protrudes from the peripheral wall into the scribe line (6) by having a lower face arranged above a top layer of the seal ring (7) of this chip (2).

8. The wafer (1a, 1b) according to claim 1, wherein a first part of the plasma etch-resistant material layer (9) protrudes from the peripheral wall into the scribe line (6) by having a lower face connected to an interconnected metal components (15) of a seal ring (7) of this chip (2).

9. The wafer (1a, 1b) according to claim 1, wherein a part of the plasma etch-resistant material layer (9) is comprised in an upper part (16) of the peripheral wall of the functional part (18) of each chip (2).

10. The wafer (1a, 1b) according to claim 1, wherein a first part of the plasma etch-resistant material layer (9) is comprised in an upper part (17) of a lateral zone of the scribe line (6), the upper part (17) being joined to the upper part (16) of the peripheral wall of a functional part (18) of each chip (2).

11. The wafer (1a, 1b) according to claim 1, wherein the plasma etch-resistant material layer (9) of each chip (2) is set up to cooperate with plasma etch-resistant material layers (9) of its neighboring chips (2) to define the inlet area (13) of the scribe line (6).

12. The wafer (1a, 1b) according to claim 1, wherein the scribe line (6) contains a material stack configured to be diced using plasma etching.

13. The wafer (1a, 1b) according to claim 1, further comprising a passivation layer (11) covering a part of an upper surface (12a) of each chip (2) exposed to the environment.

14. The wafer (1a, 1b) according to claim 1, further comprising a layer of material partially resistant (10) to plasma etching covering a passivation layer (11) arranged over a part of an upper surface (12a) of each chip (2) exposed to the environment.

15. The wafer (1a, 1b) according to claim 1, wherein the semiconductor chip (2) is a RFID chip, a NFC chip and/or a Bluetooth chip.

16. The wafer (1a, 1b) according to claim 1, further comprising a passivation layer (8) and a layer of material partially resistant (10) to plasma etching covering the passivation layer (11), wherein the passivation layer (8), the plasma etch-resistant material layer (9) and the layer of material partially resistant (10) are made from different materials.

17. The wafer (1a, 1b) according to claim 2, wherein
the free ends of the plasma etch-resistant material layers (9) are extended, starting at first ends of the free ends, each from the peripheral wall of a functional part (18) of the chip (2) into, and to second ends of the free ends, the scribe line (6),
the first ends and the second ends are opposite ends of the plasma etch-resistant material layers (9), and
the plasma etch-resistant material layers (9) are terminated at the first ends and the second ends.

18. The wafer (1a, 1b) according to claim 17, wherein
along the first direction, ends of the passivation layer (8) overlap the second ends of the free ends,
the free ends are opposite ends of the plasma etch-resistant material layers (9),
the ends of the passivation layer (8) are opposite ends of the passivation layer (8) along a second direction, perpendicular to the first direction, and
the free ends of the plasma etch-resistant material layers (9) are ones of opposite ends of the plasma etch-resistant material layers (9) along the second direction.

19. The wafer (1a, 1b) according to claim 14, wherein the plasma etch-resistant material layers (9) are closer to the front face (4a) than to the opposite backside face (4b) and are partly covered:
at first ends thereof, by both ones of first passivation layers (11) and ones of layers of material partially resistant (10) to plasma etching covering the ones of the first passivation layers (11), and
at second ends thereof, by a second passivation layer (8) that is separated, along a second direction perpendicular to the first direction, from each of the first passivation layers (11).

* * * * *